United States Patent [19]

Iwase et al.

[11] Patent Number: 5,204,206
[45] Date of Patent: Apr. 20, 1993

[54] PROCESS FOR PRODUCING DISPLAY ELEMENT, PATTERN SHEET THEREFOR, AND PROCESS FOR PRODUCING PATTERN SHEET

[75] Inventors: Teruhiko Iwase; Takeshi Imai; Toshio Koura; Yutaka Yamamura; Tsuneyuki Amano, all of Aichi, Japan

[73] Assignees: Nitto Denko Corporation, Osaka; Nippondenso Co., Ltd., Aichi, both of Japan

[21] Appl. No.: 535,620

[22] Filed: Jun. 11, 1990

[30] Foreign Application Priority Data

Jun. 10, 1989 [JP] Japan .................................. 1-147564
May 24, 1990 [JP] Japan .................................. 2-134766

[51] Int. Cl.⁵ .......................... G03C 1/68; G03F 7/00; G03F 9/00
[52] U.S. Cl. .................................. 430/253; 430/257; 430/258; 156/230; 156/240
[58] Field of Search ............... 430/253, 254, 257, 258; 156/240, 230

[56] References Cited

U.S. PATENT DOCUMENTS

| | | | |
|---|---|---|---|
| 3,785,817 | 1/1974 | Kuchta | 430/253 |
| 4,337,289 | 6/1982 | Reed et al. | 430/253 |
| 4,357,413 | 11/1982 | Cohen et al. | 430/253 |
| 4,504,571 | 3/1985 | Yamamura et al. | 430/253 |
| 5,028,511 | 7/1991 | Choi et al. | 430/253 |

FOREIGN PATENT DOCUMENTS

0295818 12/1988 European Pat. Off. .
61-172148 8/1986 Japan .
1099489 1/1968 United Kingdom .

Primary Examiner—Richard L. Schilling
Attorney, Agent, or Firm—Sughrue, Mion, Zinn, Macpeak & Seas

[57] ABSTRACT

A peel-off developable pattern sheet comprising a transparent flexible substrate having thereon a pattern comprising a photopolymerizable color image-forming material layer and a process for producing a monochromatic or multi-color patterned display element by making use of the pattern sheet(s) are disclosed. A patterned display element can be produced in a continuous manner in an organic solvent-free working environment. The formed pattern has excellent sharpness and well-controlled surface properties.

10 Claims, 2 Drawing Sheets

PROCESS FOR PRODUCING DISPLAY ELEMENT, PATTERN SHEET THEREFOR, AND PROCESS FOR PRODUCING PATTERN SHEET

FIELD OF THE INVENTION

The present invention relates to a process for producing a patterned display element which comprises forming a monochromatic or multi-colored pattern of a photocured resin in a clean working environment by using a peel-off developable pattern-forming sheet, which process can easily be carried out in a continuous manner. The present invention further relates to a pattern sheet to be used in the above-described pattern forming system and a process for producing the same.

BACKGROUND OF THE INVENTION

Screen printing has been used for producing a patterned display element comprising a color pattern formed on a metallic or plastic plate. A multi-colored pattern can be formed by repeating the printing operation by using a plurality of screens.

However, since screen printing employs a printing ink containing an organic solvent, it requires not only equipment for solvent recovery, drying, and the like but also requires much time for drying the ink, thus being poorly suited for continuous production efficiency. In particular, formation of a multi-colored pattern involves a drying treatment for each printing operation and, therefore, a long production line would be necessary for continuous operation to establish an automatic production system. Hence, adoption of such a continuous system has been substantially difficult.

Moreover, the working environment is easily contaminated with gases from the organic solvent. From hygienic standpoint, it is desirable that processes using an organic solvent be condensed into the smallest step, so as to exclude use of an organic solvent from the site of production of display elements. The requisite number of facilities for solvent recovery, drying, etc. would be reduced accordingly.

Accordingly, the present inventors have made an attempt to substitute the organic solvent-containing ink a solvent-free photocurable ink. However, such a photocurable ink turned out to exhibit radical polymerization inhibition due to atmospheric oxygen, failing to exhibit sufficient physical and chemical characteristics as demanded for production of a formed pattern.

On the other hand, a printing medium comprising a flexible substrate having provided thereon an ultraviolet-curable resin layer and a process for forming a pattern using such a printing medium have been proposed as described in JP-A-59-84240 (the term "JP-A" as used herein means an "unexamined published Japanese patent application"). In the above-described pattern forming process, the printing medium is exposed to light through a photomask resulting in a sheet having a latent image. The sheet is adhered by pressing to an adherend to transfer the uncured area to the adherend, and the transferred uncured area is then cured by exposure to light.

However, this printing system involves poor control of the surface smoothness and the evenness of the visual color of patterns. That is, when the sheet having a latent image is stripped or peeled off from the adherend, the surface layer of the uncured resin accompanies the sheet due to cohesive failure, and the surface of the ultraviolet-curable resin layer having undergone cohesive failure becomes a surface of a formed pattern. As a result, the formed pattern has a rough surface and a scattered thickness, which both cause color unevenness when seen by the eye.

SUMMARY OF THE INVENTION

An object of the present invention is to provide a process for producing a patterned display element which can be carried out in a clean working environment in a continuous manner.

Another object of the present invention is to provide a pattern sheet to be used in such a process.

Further object of the present invention is to provide a process for producing such a pattern sheet.

Other objects and effects of the present invention will be apparent from the following description.

It has now been found that the above-described disadvantages in the conventional techniques can be eliminated by a pattern forming system which comprises adhering a peel-off developable pattern-forming sheet comprising a transparent flexible substrate having thereon a photopolymerizable color image-forming material layer onto an adherend, exposing the sheet to light, and peeling off the sheet from the adherend; or a pattern forming system which comprises adhering a pattern sheet on which the image-forming material layer remains only in the areas necessary for pattern formation onto an adherend, exposing the pattern sheet to light, and peeling off the sheet from the adherend. Thus, the present invention has been completed based on these findings.

In a first embodiment, the present invention provides a process for producing a patterned display element which comprises the steps of: adhering a peel-off developable pattern-forming sheet comprising a transparent flexible substrate having thereon a photopolymerizable color image-forming material layer onto an adherend through the color image-forming material layer; exposing the pattern-forming sheet to light through a photomask having a light transmitting pattern; and peeling off the pattern-forming sheet while leaving and fixing a color pattern comprising the thus photocured color image-forming material layer on the adherend.

In a second embodiment, the present invention provides a process for producing a patterned display element which comprises the steps of: exposing both sides of a peel-off developable pattern-forming sheet, which comprises a photopolymerizable color-image forming layer having on both sides thereof transparent flexible substrates, to light through a pair of photomasks being placed on each side of the pattern-forming sheet, a first photomask of the pair of photomasks having a first light-transmitting pattern and a second photomask having a second light-shielding pattern which is the reversal of said light-transmitting pattern, in such a manner that the first light-transmitting pattern of the first photomask and a light-shielding pattern of the second photomask overlap each other, to thereby cure a surface layer of each side of the color image-forming material layer in the parts corresponding to the light-transmitting patterns of the photomasks; peeling off one of the flexible substrates; adhering the pattern-forming sheet to a transparent adherend through the exposed surface of the color image-forming material layer; exposing the color image-forming material layer to light from the side of the adherend to cure the uncured parts of the color image-forming material layer on the side in contact with the adherend and to fix the thus cured parts on the adherend; and peeling off the remaining flexible substrate from the adherend together with the color image-forming material layer remaining uncured.

In a third embodiment, the present invention provide a peel-off developable pattern sheet comprising a transparent flexible substrate having thereon a pattern comprising a photopolymerizable color image-forming material layer, and a process for producing such a pattern sheet which comprises the steps of: adhering the above-described pattern-forming sheet to an adherend through the color image-forming material layer; exposing the flexible substrate side of the pattern-forming sheet to light through a photomask having a light-shielding pattern; and peeling off the pattern-forming sheet from the adherend while leaving and fixing a pattern comprising the unexposed parts of the color image-forming material layer remaining on the flexible substrate.

In a forth embodiment, the present invention provides a process for producing a patterned display element which comprises the steps of: adhering the above-described pattern sheet onto an adherend through the pattern on the pattern sheet; exposing the pattern sheet to light; and peeling off the pattern sheet while leaving and fixing a color pattern comprising the thus photocured color image-forming material layer on the adherend, and a process for forming a multi-colored patterned display element which comprises repeating the above-described procedure using a combination of a plurality of pattern sheets having a prescribed pattern different in color.

BRIEF DESCRIPTION OF THE DRAWINGS

FIGS. 1-(a) through 1-(e) illustrate a flow chart for an embodiment of the production of a patterned display element according to the present invention.

FIGS. 2-(a) through 2-(e) illustrate a flow chart for another embodiment of the production of a patterned display element according to the present invention.

FIGS. 3-(a) through 3-(d) illustrate a flow chart for the production of the pattern sheet according to the present invention.

FIGS. 4-(a) through 4-(m) illustrate a flow chart for the production of a patterned display element having a multi-color pattern.

DETAILED DESCRIPTION OF THE INVENTION

The terminology "transparent" as used for flexible substrates and adherends means light-transmitting properties and therefore includes semi-transparent property.

The color image-forming material layer of the present invention is rapidly cured on exposure to light due to its photopolymerizability. On curing, the color image-forming material layer is protected against access of air by the transparent flexible substrate so that photocuring proceeds rapidly and sufficiently without substantial inhibition by atmospheric oxygen. Where, in particular, the color image-forming material layer contains a film-forming polymer as hereinafter described, there is formed a color pattern having well-balanced strength and adhesion to an adherend.

The photopolymerizable color image-forming material may contain an appropriate colorant to have a variety of color to choose from, including blackish hues, reddish hues, yellowish hues, etc.

On the other hand, the color image-forming material layer exhibits moderate adhesiveness so as to be easily peeled off from an adherend and, upon exposure to light, is photocured to be firmly fixed to the adherend. Thus, peel-off development can be performed by adhering the color image-forming material layer provided on a flexible substrate to an adherend and exposing any desired area thereof to light for photocuring. The uncured parts (unexposed parts) of the color image-forming material layer can then be removed from the adherend by peeling off the flexible substrate, while the photocured parts (exposed parts) are fixed to the adherend to form a color pattern. No organic solvent takes part in the above-described peel-off development, thus realizing solvent-free dry development.

Further, according to the system in which a pattern-forming sheet or a pattern sheet is exposed to light while being adhered to an adherend and then peeled off, the peeling of the sheet is conducted while the parts corresponding to a desired pattern having already been photocured. Hence, the surface properties of the flexible substrate of the pattern-forming sheet or pattern sheet can be reflected on the surface of the formed pattern with high precision. That is, gloss, matte finish, smoothness, or the like surface properties of the pattern can easily be controlled. In addition, when the sheet is peeled off, the formed pattern is prevented from accompanying the sheet due to cohesive failure, thus achieving improved uniformity of pattern thickness and color.

Moreover, in the pattern forming system in which a surface layer on each side of the color image-forming material layer is previously photocured in parts, and only the parts necessary for pattern formation are then cured by light exposure from the side of the adherend, the parts unnecessary for pattern formation can be easily released from the adherend because the surface of these parts contacting the adherend has already been cured. As a result, a pattern having an improved resolving power and an improved sharpness can be formed.

Figure 1A:
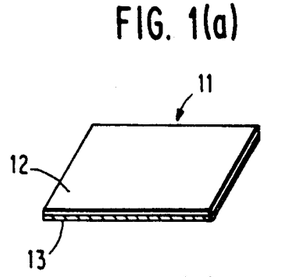
Figure 1B:
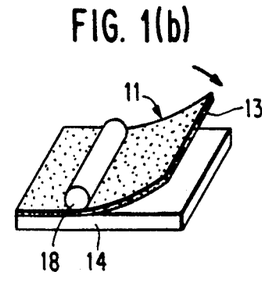
Figure 1C:
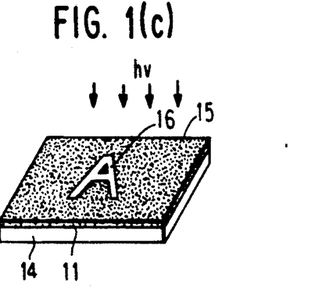
Figure 1D:
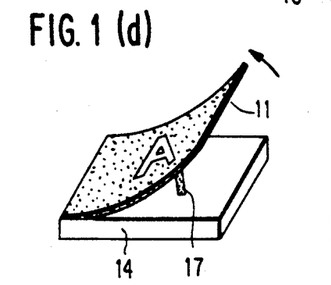
Figure 1E:
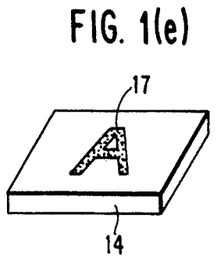
Figure 2A:
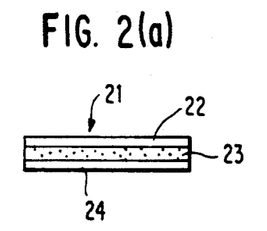
Figure 2B:
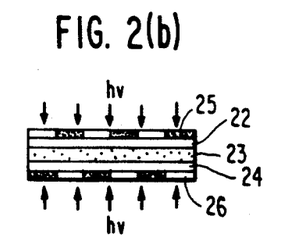
Figure 2C:
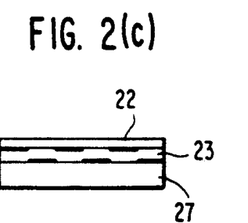
Figure 2D:
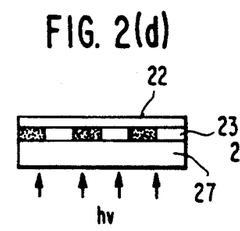
Figure 2E:
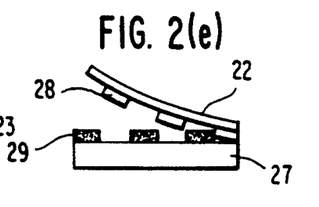

The peel-off developable pattern-forming sheet which can be used in the present invention comprises a photopolymerizable color image-forming material layer having a transparent flexible substrate on one or both sides thereof (FIGS. 1-(a) and 2-(a)). In the latter type of the pattern-forming sheet, an easily releasable substrate, such as a separator, is usually employed as one of the flexible substrates.

The photopolymerizable color image-forming material can be prepared from, for example, a film-forming polymer, a compound having an addition-polymerizable unsaturated bond, a photopolymerization initiator, and a colorant, as described in JP-A-57-58140, JP-A-57-58141, JP-A-57-60327, JP-A-57-60328, JP-A-57-62046, and JP-A-57-62047.

Film-forming polymers which can be used are not particularly limited. Those having good compatibility with other compounding components for the image-forming material are preferred. Examples of such film-forming polymers include chlorinated polyolefins, e.g., chlorinated polyethylene and chlorinated polypropylene; polyacrylates, e.g., polymethyl methacrylate and polymethyl acrylate; vinyl polymers, e.g., polyvinyl chloride, polyvinylidene chloride, polyvinyl butyral, polyvinyl acetate, a vinyl chloride-vinyl acetate copolymer, and a vinylidene chloride-acrylonitrile copolymer; rubbery polymers, e.g., polyisoprene, chlorinated rubber, polychloroprene, chlorosulfonated polyethylene, and chlorosulfonated polypropylene; solvent-soluble linear saturated polyesters; and a styrene-maleic acid copolymer.

Compounds having an addition-polymerizable unsaturated bond which can be used contains at least one, and preferably at least two, addition-polymerizable unsaturated bonds. Examples of such compounds include polyacrylates or polymethacrylates of a polyhydric alcohol, acrylate oligomers, methacrylate oligomers, epoxy acrylates, and urethane acrylates. Examples of the polyhydric alcohol includes polyethylene glycol, polypropylene oxide, polybutylene oxide, (β-hydroxyethoxy)benzene, glycerin, diglycerin, neopentyl glycol, trimethylolpropane, triethylolpropane, pentaerythritol, dipentaerythritol, 1,4-butanediol, 1,2,4-butanetriol, 2-butene-1,4-diol, 2-butyl-2-ethylpropanediol, 2-butene-1,4-diol, 1,3-propanediol, triethanolamine, decalindiol, and 3-chloro-1,2-propanediol.

The compound having an addition-polymerizable unsaturated bond is generally used in an amount of from 10 to 500 parts by weight, and preferably from 50 to 200 parts by weight, per 100 parts by weight of the film-forming polymer.

Photopolymerization initiators which can be used are appropriately selected from generally employed photopolymerization initiators, such as carbonyl compounds, organic sulfur compounds, peroxides, redox compounds, azo compounds, diazo compounds, and photo-reducible dyes. Specific examples of the photopolymerizable initiators include carbonyl compounds, e.g., benzoin, benzoin methyl ether, benzoin isopropyl ether, benzoin isobutyl ether, benzyl dimethyl ketal, benzophenone, anthraquinone, 2-methylanthraquinone, 2-t-butylanthraquinone, 9,10-phenanthrenequinone, diacetyl, benzil, Michler's ketone, and 4,4-bisdiethylaminobenzephenone; organic sulfur compounds, e.g., dibutyl disulfide, dioctyl disulfide, dibenzyl disulfide, diphenyl disulfide, dibenzoyl disulfide, and diacetyl disulfide; peroxides, e.g., hydrogen peroxide, di-t-butyl peroxide, benzoyl peroxide, and methyl ethyl ketone peroxide; redox compounds comprising a combination of a reducing agent and a peroxide, e.g., a combination of a ferrous ion and hydrogen peroxide, a combination of a ferrous ion and a persulfate ion, and a combination of a ferric ion and a peroxide; azo compounds, e.g., α,α'-azobisisobutyronitrile, 2-azobis-2-methylbutyronitrile, and 1-azobiscyclohexanecarbonitrile; diazo compounds, e.g., p-aminodiphenylamine; and photo-reducible dyes, e.g., Rose Bengale, Erythrosine, Eosine, acriflavine, riboflavine, and Thionine.

The amount of the photopolymerization initiator to be used is appropriately decided. In general, it is used in an amount of from 0.1 to 20 parts by weight per 100 parts by weight of the compound having an addition-polymerizable unsaturated bond.

Colorants which can be used are selected from commonly employed colorants, such as pigments. Those having excellent weather resistance are preferred. Examples of weather resistant colorants include synthetic pigments, e.g., chromates, ferrocyanides, sulfides, sulfates, oxides, hydroxides, carbonates, and silicates; inorganic substances, e.g., carbon powder and metallic powders; and organic substances, e.g., nitroso pigments, nitro pigments, azo pigments, phthalocyanine pigments, basic dye lake pigments, acid dye lake pigments, and polycyclic pigments.

The colorant is used in an appropriately selected amount, generally of from 2 to 50% by weight based on the color image-forming material layer.

If desired, in the preparation of the photopolymerizable color image-forming material, two or more of the above-described film-forming high polymers, compounds having an addition-polymerizable unsaturated bond, photopolymerization initiators, or colorants may be used in combination. It is preferred that the photopolymerizable color image-forming material has such a composition that a photocured product obtained by exposure to light, i.e., a formed color pattern may have a hiding power of 2.5 or more as measured by using a transmission densitometer (DM-500 made by Dainippon Screen Mfg. Co., Ltd.).

The color image-forming material layer can be formed by, for example, coating a composition prepared by mixing the above-described components by using a organic solvent, etc. on a flexible substrate, followed by drying. If desired the coating composition may additionally contain appropriate additives, such as an adhesion improving agent, a denaturation inhibitory agent, a thermal polymerization inhibitor, a filler, and a plasticizer.

The thickness of the color image-forming material layer is appropriately selected, generally from 5 to 50 μm.

The flexible substrate which can be used in the present invention should be transparent and preferably has excellent light transmission properties in the wavelength region of from 300 to 500 nm. Examples of the flexible substrates include films of synthetic resins, e.g., polyethylene terephthalate, polypropylene, polyethylene, cellulose triacetate, cellulose diacetate, polyvinyl chloride, polyvinyl alcohol, polycarbonate, polystyrene, cellophane, vinylidene chloride-based copolymers, and polyamide resins (e.g., 6-nylon, 6,6-nylon, and 6,10-nylon); and composite films comprising two or more of these synthetic resins. The thickness of the flexible substrate is appropriate decided depending on the strength or light transmittance required, and generally ranges from 6 to 150 μm, and preferably from 12 to 50 μm.

The color image-forming material layer formed on the flexible substrate is preferably protected with a separator, etc. during transportation and preservation. Where the separator, etc. is transparent (light-transmitting), such a structure also serves as a pattern-forming sheet having a flexible substrate on both sides of the color image-forming material layer according to FIG. 2-(a).

The pattern-forming sheet of the present invention is used as it is for the production of a patterned display element and also for the production of a pattern sheet.

The process for producing a patterned display element according to the first embodiment of the present invention is depicted in FIGS. 1-(a) through (e). Pattern-forming sheet (11) used in this embodiment comprises color image-forming material layer (13) having flexible substrate (12) on one side thereof. Pattern-forming sheet (11) is adhered to adherend (14), through color image-forming material layer (13), by means of laminating roll (18) (FIGS. 1-(a) to (b)). Pattern-forming sheet (11) is then exposed to light from the substrate side through photomask (15) having prescribed light-transmitting pattern (16) by means of a ultraviolet irradiation apparatus, etc. (FIG. 1-(c)) to thereby cure color image-forming material layer (13) on the area corresponding to pattern (16) and fix the cured layer to adherend (14). Thereafter, pattern-forming sheet (11) is peeled off to complete peel-off development (FIG. 1-(d)). There is thus obtained a display element in which color pattern (17) comprising the photocured layer is fixed on the adherend (FIG. 1-(e)).

The above-mentioned embodiment in which a pattern-forming sheet itself is utilized is suitable for the production of a display element having a monochromatic pattern.

This embodiment can be carried out in a continuous manner by arranging a step of adhering a pattern-forming sheet to an adherend by using a laminator, etc., a step of superposing a photomask on the pattern-forming sheet adhered to the adherend, a step of light exposure, e.g., in an exposure zone, and a step of peeling off the exposed pattern-forming sheet in sequence, and an adherend is made to run on the thus arranged production line at a constant speed. If desired, adhesion of the pattern-forming sheet to an adherend may be conducted under heating. Heating is generally effective to improve adhesive strength. Further, superposition of the photomask on the pattern-forming sheet can be conducted by a vacuum adhesion system to prevent slippage of the photomask out of position. Furthermore, when the pattern-forming sheet is removed from the adherend after light exposure, heat may be applied to aid smooth peeling.

In the second embodiment of the process for producing a patterned display element, pattern-forming sheet (21) comprising color image-forming material layer (23) having flexible substrates (22) and (24) on each side thereof is employed as shown in FIGS. 2-(a) to (d). Photomask (25) having a prescribed light-transmitting pattern is placed on one side of pattern-forming sheet (21), while photomask (26) having a pattern whose light-transmitting part and light-shielding part are the reversal of those of photomask (25) being placed on the other side of pattern-forming sheet (21). The pattern-forming sheet is then exposed to light from both sides thereof through photomasks (25) and (26) to conduct photocuring (FIG. 2-(b)). The photocuring in this stage should be effected to such an extent that not the whole thickness but a part, at least the surface layer, of color image-forming material layer (23) on the exposed area may be cured. Then, one of the two flexible substrates (24) is removed by peeling, and the exposed surface of color image-forming material layer (23) is adhered to transparent adherend (27) by means of a laminating roll, etc. (FIG. 2-(c)). Flexible substrate (24) which is to be removed is the one contacting with the cured surface layer of color image-forming material layer (23) which should be removed later for forming a desired pattern. The color image-forming material layer (23) is then exposed to light from the side of adherend (27) (FIG. 2-(d)) whereby the uncured part of the color image-forming material layer which is in contact with adherend (27) is cured and fixed to adherend (27). Finally, pattern-forming sheet (22) is peeled off from adherend (27) whereby parts of the color image-forming material layer (28) whose side contacting with flexible substrate (22) remains uncured, i.e., the parts which should be removed for pattern forming, are removed together with the pattern-forming sheet (flexible substrate (28)), to complete peel-off development (FIG. 2-(e)). There can be thus obtained adherend (27) having thereon color pattern (29).

Each step included in this second embodiment can be carried out in the same manner as described with respect to the first embodiment. Continuous production can be performed by, for example, arranging in sequence a step of superposing photomasks on a pattern-forming sheet, a step of first light exposure in an exposure zone, etc., a step of peeling one of the flexible substrates from the pattern-forming sheet, a step of adhering the pattern-forming sheet to an adherend by means of a laminator, etc., a step of second light exposure from the adherend side in an exposure zone, etc., and a step of peeling the pattern-forming sheet after the second light exposure and making the adherend run on the thus arranged production line at a constant speed.

According to this second embodiment in which a surface layer on both sides of the color image-forming material layer is partly cured, since the surface layer of the color image-forming material layer on the areas where no pattern is formed is subjected to curing treatment, the pattern-forming sheet (i.e., unnecessary parts of the color image-forming material layer) has excellent release properties. Even where an adhesive substance is used, the pattern-forming sheet can be easily released. Therefore, this pattern forming system is advantageously applicable not only to the formation of a monochromatic pattern but also to the formation of a multi-color pattern. Formation of a multi-color pattern according to this system can be carried out by, for example, forming monochromatic patterns in a successive manner on the same adherend by using a combination of a plurality of pattern-forming sheets having different patterns and colors.

The pattern sheet according to the present invention comprises a transparent flexible substrate having thereon a pattern comprising a photopolymerizable color image-forming material layer. Examples of the pattern sheet are illustrated in FIGS. 3-(d), 4-(a), 4-(e), and 4-(i). In these figures, each pattern sheet (34) comprises transparent flexible substrate (12) on which a photopolymerizable color image-forming material layer is partly provided to form pattern (35), (41) or (44).

The pattern sheet may be prepared by partly coating a flexible substrate with a photopolymerizable color image-forming material by using, for example, a mask having a through-hole pattern. Further, a multi-color pattern may be formed on the same flexible substrate by repeating the above-described coating operation using a plurality of color image-forming materials having different colors.

Figures 3A, 3B:
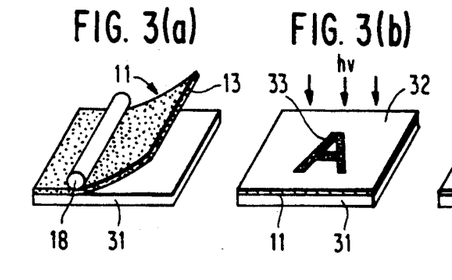
Figures 3C, 3D:
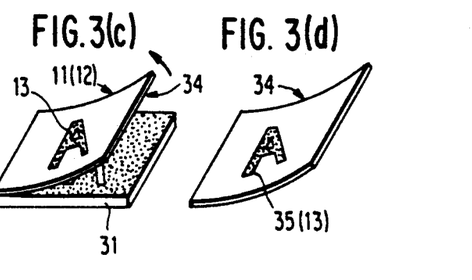
Figure 4A:
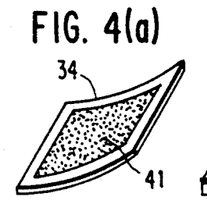
Figure 4B:
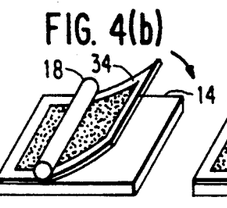
Figure 4C:
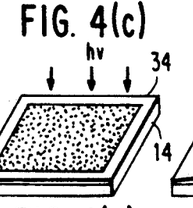
Figure 4D:
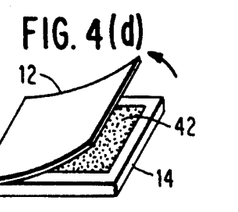
Figure 4E:
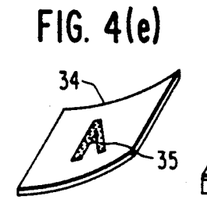
Figure 4F:
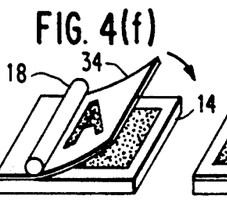
Figure 4G:
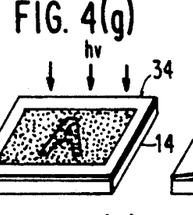
Figure 4H:
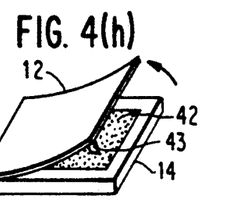
Figure 4I:
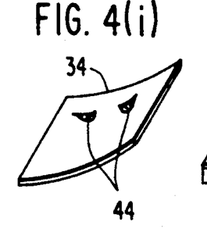
Figure 4J:
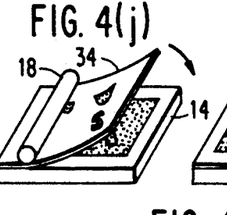
Figure 4K:
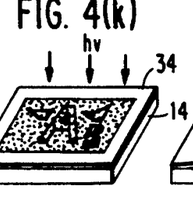
Figure 4L:
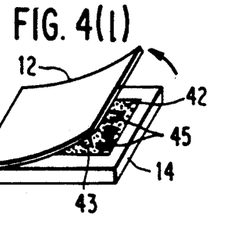
Figure 4M:
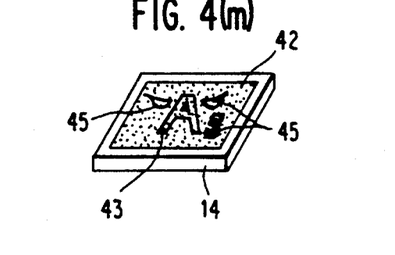

Production of a pattern sheet having an arbitrary pattern in a clean working environment can be achieved by making use of the above-described pattern-forming sheet according to the flow chart of FIGS. 3-(a) through 3-(d). In this embodiment, pattern-forming sheet (11) is adhered to adherend (31) through color image-forming material layer (13) thereof (FIG. 3-(a)). The sheet is then exposed to light through photomask (32) having prescribed light-shielding pattern (33) (FIG. 3-(b)) whereby the unexposed area of color image-forming material layer corresponding to pattern (33) remains uncured. On peeling off pattern-forming sheet (11) for peel-off development (FIG. 3-(c)), only the unexposed area (uncured part) is removed together with flexible substrate (12) while leaving and fixing the exposed area (photocured part) on adherend (31). There is thus obtained pattern sheet (34) comprising a flexible substrate having thereon pattern (35) comprising the uncured color image-forming material layer (FIG. 1-(d)). This pattern sheet is peel-off developable because the pattern is composed of the color image-forming material layer.

The above-described production of the pattern sheet can be carried out in a continuous manner according to the same system as described above with respect to the production of the pattern-forming sheet.

Production of a display element by the use of the pattern sheet is illustrated in FIGS. 4-(a) through 4-(d). In this embodiment, pattern sheet (34) is adhered to adherend (14) through pattern (41) (FIG. 4-(b)) and exposed to light (FIG. 4-(c)) whereby pattern (41) comprising the color image-forming material sheet is photocured and fixed to adherend (14), and the pattern sheet is peeled off to complete peel-off development 4-(d)). There can be thus obtained adherend (14) having thereon color pattern (42).

By the use of the pattern sheet, a display element having a multi-color pattern can be efficiently produced. The process for producing a display element having a multi-color pattern is illustrated in FIGS. 4-(a) through 4-(m). In this embodiment, patterned display element 4-(m) is obtained by using three pattern sheets (34) in FIGS. 4-(a), 4-(e) and 4-(i) having pattern (41), (35) and (44), respectively, different in color.

First of all, adherend (14) on which photocured color pattern (42) is fixed is prepared by using pattern sheet (34) in FIG. 4-(a) in accordance with the above-mentioned procedure. Then, color pattern (43) is added to the adherend with pattern (35) by using pattern sheet (34) in FIG. 4-(e) through the same peel-off development procedure including adhesion FIG. 4-(f), exposure FIG. 4-(g), and peeling 4-(h). Finally, color pattern (45) is further added to the adherend with patterns (42) and (43) by using pattern sheet (34) in FIG. 4-(i) through the same peel-off development procedure FIGS. 4-(f), 4-(g) 4-(h). There is thus obtained patterned display element in FIG. 4-(m) having patterns (42), (43) and (45) combined on the same adherend to form a desired multi-color pattern.

According to the above-described process, a pattern composed of an arbitrary combination of pattern elements can be formed by repeating the peel-off development of an arbitrary number of pattern sheets having a prescribed pattern element on the same adherend while registering each of the pattern sheets. The pattern sheets to be used may be previously prepared, or the production of the pattern sheets may be incorporated into the production line for the display element. The former system is preferred from the viewpoint of reduction of the production line. The desired pattern may be appropriately divided into a plurality of pattern elements according to, for example, color.

Continuous production of a display element having a multi-color pattern can be carried out by, for example, arranging peel-off development cycles each comprising a step of adhering a pattern sheet to an adherend, a step of light exposure, and a step of peeling in sequence according to the number of pattern sheets to be combined and making an adherend run on the arranged production line at a constant speed.

The adherend on which a pattern can be formed is not particularly limited. It should be noted, however, that where a color image-forming material layer is exposed to light from the side of an adherend, the adherend should be light-transmitting. In the present invention, since a pattern is formed through exposure to light, such as ultraviolet light, an adherend having poor heat resistance can be employed. Examples of generally used adherends include metallic or plastic plates or sheets. In order to improve adhesion between an adherend and a color pattern comprising a photocured color image-forming material, the adherend may be subjected to an appropriate physical, mechanical or chemical treatment, such as grinding, corona discharge treatment, sputtering, primer coating, and the like.

Primers which can be used may be those capable of reacting with a pattern formed and adhering thereto when the uncured color image-forming material is cured on exposure to light. Examples of such primers include a solvent-soluble linear saturated polyester resin alone or a photopolymerizable primer comprising a saturated polyester resin as a film-forming polymer, the above-enumerated acrylate containing at least one additional-polymerizable unsaturated bond as a photopolymerizable color image-forming material, and a photopolymerization initiator. These primers can be applied in the form of a film in the same manner as described with respect to the formation of a photopolymerizable color image-forming material layer.

The adherend which is used in the production of a pattern sheet is not limited because it is removed afterward. Those easy to handle, such as synthetic resin films, are preferably used. From the viewpoint of obtaining a sharp pattern, an adherend to which a photocured part firmly sticks is preferred.

According to the process for producing a patterned display element of the present invention in which a peel-off developable pattern-forming sheet or pattern sheet is used, use of an organic solvent can be excluded from the pattern formation, making it possible to perform the operation under a clean working environment. Further, rapid pattern formation by peel-off development shortens the required line length and makes it possible to produce a patterned display element in a continuous manner. Hence, an automatic production system can easily be adopted. Furthermore, a sufficiently cured color pattern having a variety of color inclusive of a black color with high hiding power can easily be obtained. In addition, since peel-off development is preceded by light exposure and fixing, the resulting pattern is excellent in evenness of thickness and color and, also, the surface condition of the pattern, such as matte finish, can be highly controlled. Where, in particular, the surface layer on each side of the color image-forming material layer is partially cured, the unnecessary parts of the color image-forming material layer are easily released from the adherend to form a pattern excellent in resolving power or image sharpness.

Additionally, the process for producing a pattern sheet according to the present invention efficiently provides a sheet having a desired pattern under a clean working environment and also can be carried out in a continuous manner. The resulting pattern sheet makes it possible to efficiently produce a multi-color pattern. The process for producing a display element by taking advantage of such a pattern sheet achieves high efficiency particularly in the formation of a multi-colored pattern.

The present invention is now illustrated in greater detail by way of Reference Examples, Examples, and Comparative Example, but it should be understood that the present invention is not deemed to be limited thereto. All the parts are given by weight unless otherwise indicated.

REFERENCE EXAMPLE 1

65 parts of chlorinated polyethylene having a weight average molecular weight of 20,000 to 30,000, 30 parts of polymethyl methacrylate having a weight average molecular weight of 80,000 to 90,000, 5 parts of a saturated polyester having a weight average molecular weight of about 20,000, 50 parts of an acrylate oligomer having a weight average molecular weight of about 500, 80 parts of an acrylate oligomer having a weight average molecular weight of about 200, 6 parts of benzophenone, 1.5 parts of Michler's ketone, and 4 parts of carbon black were mixed by using 400 parts of toluene. The resulting mixture was coated on a 25 μm thick transparent polyethylene terephthalate film and dried at 80° C. for 10 minutes to obtain a pattern-forming sheet having a 30 μm thick black image-forming material layer.

REFERENCE EXAMPLE 2

A pattern sheet having a 20 μm thick white image-forming material layer was prepared in the same manner as in Reference Example 1, except for replacing benzophenone and Michler's ketone by 5 parts of benzyl methyl ketal and replacing carbon black by 15 parts of titanium dioxide.

EXAMPLE 1

The pattern-forming sheet obtained in Reference Example 1 was adhered to a polycarbonate sheet, the surface of which had been roughened, through the black image-forming material layer thereof, by the use of a laminating roll heated to about 50° C. The surface roughening of the polycarbonate sheet was carried out by mechanical grinding with a scrubbing roll or a brushing roll. A photomask having a prescribed light-transmitting pattern was brought into tight contact with the pattern-forming sheet by vacuum adhesion, and the sheet was exposed to light emitted from a ultrahigh-pressure mercury lamp (3 kW) placed 60 cm above the sheet through the photomask for about 20 seconds. The pattern-forming sheet was then peeled off at room temperature.

There was thus obtained a display element comprising the polycarbonate sheet having thereon a black pattern comprising a photocured product of the color image-forming material layer and corresponding to the light-transmitting pattern of the photomask. The resulting black pattern did not peel off on rubbing with finger tips.

EXAMPLE 2

A display element comprising a polycarbonate sheet having thereon a white pattern was obtained in the same manner as in Example 1, except that the pattern-forming sheet in Reference Example 2 was used and the surface roughening of the polycarbonate sheet was carried out by sandblasting to give fine unevenness. The resulting white pattern did not peel off on rubbing with finger tips.

EXAMPLE 3

A separator made of a transparent polyester film having been treated with a silicone release agent was adhered to the surface of the white image-forming material layer of the pattern-forming sheet obtained in Reference Example 2. A photomask having a prescribed light-transmitting pattern was superposed on one side of the pattern-forming sheet (the side of the substrate), and a photomask having a light-shielding pattern which was the reversal of the photomask used above was superposed on the other side (i.e., the side of the separator). After tightly contacting the photomasks to the pattern-forming sheet by vacuum adhesion, the sheet was exposed to light from both sides for about 5 seconds using a ultrahigh-pressure mercury lamp (3 kW) placed 60 cm above the sheet to partly cure only the surface layer on each side of the white image-forming material layer. The separator was peeled off at room temperature. The exposed surface of the white image-forming material layer was then adhered to a surface-roughened polycarbonate sheet by the use of a laminating roll heated to about 50° C. The white image-forming material layer was exposed to light from the side of the polycarbonate sheet for about 20 seconds by using a ultrahigh-pressure mercury lamp (3 kW) placed 60 cm above, and the pattern-forming sheet was then peeled off at room temperature.

There was thus obtained a display element comprising the polycarbonate sheet having formed thereon a white pattern comprising a photocured product of the white image-forming material layer and corresponding to the pattern of the photomasks. The resulting white pattern did not peel off on rubbing with finger tips. The release of the pattern-forming sheet from the polycarbonate sheet was smooth, and the resulting pattern was sharp.

EXAMPLE 4

A display element having a black-and-white bicolored pattern was obtained in the same manner as in Example 3, except for using the pattern-forming sheet obtained in Example 1, using the display element obtained in Example 3 as an adherend, and changing the pattern of the photomasks.

The bicolored pattern did not peel off on rubbing with finger tips. The pattern-forming sheet was smoothly released from the display element without giving influences to the white pattern base, and the formed pattern was sharp.

EXAMPLE 5

The pattern-forming sheet obtained in Reference Example 2 was adhered to a surface-roughened copper plate, through the white image-forming material layer, by means of a laminating roll heated to about 50° C. The surface roughening of the copper plate was effected by mechanical grinding with a scrubbing roll or a brushing roll. A photomask having a prescribed light-shielding pattern was brought into close contact with the pattern-forming sheet and exposed to light emitted from a ultrahigh-pressure mercury lamp (3 kW) placed 60 cm above for about 20 seconds. The pattern-forming sheet was then peeled off.

There was thus obtained a pattern sheet comprising a polyethylene terephthalate film having thereon a pattern comprising an uncured color image-forming material layer and corresponding to the light-shielding pattern of the photomask, with the photocured part of the color image-forming material layer having been removed therefrom.

EXAMPLE 6

A pattern sheet was obtained in the same manner as in Example 5, except for replacing the pattern-forming sheet of Reference Example 2 by that of Reference Example 1, changing the exposure time to about 30 seconds, and using a photomask having a different light-shielding pattern.

The resulting pattern sheet comprised a polyethylene terephthalate film having thereon a pattern comprising the uncured color image-forming material layer and corresponding to the light-shielding part of the photomask, with the photocured part of the color image-forming material layer having been removed therefrom.

EXAMPLE 7

The pattern sheet prepared in Example 5 was adhered to a surface-roughened polycarbonate sheet while registering, through the pattern-forming side thereof, by means of a laminating roll heated to about 50° to 60° C. The pattern sheet was then exposed to light for about 20 seconds by using a ultrahigh-pressure mercury lamp (3 kW) placed 60 cm above, and the pattern sheet was peeled off at room temperature.

There was thus obtained a display element comprising a polycarbonate sheet having thereon a white pattern comprising a photocured product of the color imiage-forming material layer remaining on the pattern sheet.

Then, the pattern sheet prepared in Example 6 was adhered, while registering, to the polycarbonate sheet with the white pattern on it, through the pattern-forming side thereof, by the use of a laminating roll heated to about 50° to 60° C. The adhered pattern sheet was exposed to light emitted from a ultrahigh-pressure mercury lamp (3 kW) placed 60 cm above for about 30 seconds and then peeled off at room temperature.

As a result, the color image-forming material layer remaining on the pattern sheet was photocured to add a black pattern to the polycarbonate sheet, thus providing a display element having a bicolored pattern composed of a white pattern and a black pattern. Each of the white and black patterns did not peel off on rubbing with finger tips.

EXAMPLE 8

Pattern sheets containing a red or yellow image-forming material layer, respectively, whose pattern differed from each other and also from that of the pattern sheet of Example 5 or Example 6 were prepared in the same manner as in Example 5.

A display element having a multi-color pattern comprising a combination of four colors was produced by using these pattern sheets and the pattern sheets of Examples 5 and 6 in the same manner as in Example 7. Each of the thus formed patterns did not peel off on rubbing with finger tips.

COMPARATIVE EXAMPLE

A black pattern was added to the patterned surface of the display element obtained in Example 2 in accordance with the procedure of Example 1. In this case, a photomask used had a light-transmitting pattern which did not overlap on the white pattern previously formed on the adherend, i.e., the display element of Example 2.

After light exposure, when the pattern-forming sheet was peeled off from the adherend, the unnecessary uncured part in the pattern-forming sheet remained stuck to the adherend probably due to strong adhesion between the white pattern base and the black image-forming material layer, failing to form a desired pattern.

While the invention has been described in detail and with reference to specific embodiments thereof, it will be apparent to one skilled in the art that various changes and modifications can be made therein without departing from the spirit and scope thereof.

What is claimed is:

1. A process for producing a patterned display element which comprises the steps of:

adhering a peel-off developable pattern-forming sheet comprising a transparent flexible substrate having thereon a photopolymerizable color image-forming material layer onto an adherend through said color image-forming material layer;

exposing said pattern-forming sheet to light through a photomask having a light transmitting pattern; and peeling off said pattern-forming sheet while leaving and fixing a color pattern comprising the thus photocured color image-forming material layer on said adhered, wherein the photopolymerizable color image-forming material layer contains a colorant having weather resistant properties and is capable of endowing a photocured product of the color image forming material layer with a hiding power of 2.5 or more as measured by a transmission densitometer.

2. A process for producing a patterned display element which comprises the steps of:

exposing both sides of a peel-off developable pattern-forming sheet, which comprises a photopolymerizable color image-forming material layer having on both sides thereof transparent flexible substrates, to light through a pair of photomasks being placed on each side of said pattern-forming sheets, a first photomask of said pair of photomasks having a first light-transmitting pattern that corresponds to the light-shielding portions of a second mask and a light-shielding pattern of the first mask that corresponds to light-transmitting portions of the second mask, to thereby cure a surface layer of each side of said color image-forming material layer in the parts corresponding to said light-transmitting patterns of said photomasks;

peeling off one of said flexible substrates;

adhering said pattern-forming sheet to a transparent adhered through the exposed surface of said color image-forming material layer;

exposing said color image-forming material layer to light from the side of said adherent to cure the uncured parts of said color image-forming material layer on the side in contact with said adherend and to fix the thus cured parts on said adherend; and peeling off the remaining flexible substrate from said adherent together with said color image-forming material layer remaining uncured, wherein the photopolymerizable color image-forming material layer contains a colorant having weather resistant properties and is capable of endowing a photocured product of the color image forming material layer with a hiding power of 2.5 or more as measured by a transmission densitometer.

3. A process for producing a patterned display element as claimed in claim 2, wherein said color image-forming materail layer comprises a composition containing a film-forming polymer, a compound having at least one addition-polymerizable unsaturated bond, a photopolymerization initiator, and a colorant.

4. A process for producing a peel-off developable pattern sheet comprising a transparent flexible substrate having thereon a pattern comprising a photopolymerizable color image-forming material layer, said process comprising the steps of:

adhering a peel-off developable pattern-forming sheet comprising a transparent flexible substrate having thereon a photopolymerizable color image-forming material layer to an adherend through said color image-forming material layer;

exposing the flexible substrate side of said pattern-forming sheet to light through a photomask having a light-shielding pattern; and peeling off said pattern-forming sheet from said adherent while leaving and fixing a pattern comprising the unexposed parts of said color image-forming material layer remaining on said flexible substrate, wherein the photopolymerizable color image-forming material layer contains a colorant having weather resistant properties and is capable of endowing a photocured product of the color image forming material layer with a hiding power of 2.5 or more as measured by a transmission densitometer.

5. A process for producing a patterned display element which comprises the steps of:

adhering a peel-off developable pattern sheet comprising a transparent flexible substrate having thereon a pattern comprising a photopolymerizable color image-forming material layer onto an adherend through said pattern;

exposing said pattern sheet to light; and peeling off said pattern sheet while leaving and fixing a color pattern comprising the thus photocured color image-forming material layer on said adherend, wherein the photopolymerizable color image-forming material layer contains a colorant having weather resistant properties and is capable of endowing a photocured product of the color image forming material layer with a hiding power of 2.5 or more as measured by a transmission densitometer.

6. A process for forming a patterned display element having a multi-color pattern which comprises the steps of:

adhering a peel-off developable pattern sheet comprising a transparent flexible substrate having thereon a pattern comprising a photopolymerizable color image-forming material layer onto an adherend through said pattern;

exposing said pattern sheet to light;

peeling off said pattern sheet while leaving and fixing a color pattern comprising the photocured color image-forming material layer on said adherend to complete one cycle; and repeating said cycle using a combination of a plurality of pattern sheets each having a prescribed pattern different in color, wherein the photopolymerizable color image-forming material layer contains a colorant having weather resistant properties and is capable of endowing a photocured product of the color image forming material layer with a hiding power of 2.5 or more as measured by a transmission densitometer.

7. A process for producing a patterned display element as claimed in claim 1, wherein said color image-forming material layer comprises a composition containing a film-forming polymer, a compound having at least one addition-polymerizable unsaturated bond, a photopolymerization initiator, and a colorant. addition-polymerizable unsaturated bond, a photopolymerization initiator, and a colorant.

8. A process for producing a peel-off developable pattern sheet as claimed in claim 4, wherein said color image-forming material layer comprises a composition containing a film-forming polymer, a compound having at least one addition-polymerizable unsaturated bond, a photopolymerization initiator, and a colorant.

9. A process for producing a patterned display element as claimed in claim 5, wherein said color image-forming material layer comprises a composition containing a film-forming polymer, a compound having at least one addition-polymerizable unsaturated bond, a photopolymerization initiator, and a colorant.

10. A process for forming a patterned display element as claimed in claim 6, wherein said color image-forming material layer comprises a composition containing a film-forming polymer, a compound having at least one addition-polymerizable unsaturated bond, a photopolymerization initiator, and a colorant.

* * * * *